(12) United States Patent
Chun (10) Patent No.: US 9,842,632 B2
(45) Date of Patent: Dec. 12, 2017

(54) BIT LINE EQUALIZER

(71) Applicant: SK hynix Inc., Icheon-si, Gyeonggi-do (KR)

(72) Inventor: Duk Su Chun, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 90 days.

(21) Appl. No.: 15/047,408

(22) Filed: Feb. 18, 2016

(65) Prior Publication Data

US 2017/0084319 A1    Mar. 23, 2017

(30) Foreign Application Priority Data

Sep. 22, 2015 (KR) .......................... 10-2015-0133963

(51) Int. Cl.
*G11C 7/12* (2006.01)
*H01L 27/108* (2006.01)

(52) U.S. Cl.
CPC .............. *G11C 7/12* (2013.01); *H01L 27/108* (2013.01); *G11C 2207/12* (2013.01)

(58) Field of Classification Search
CPC ........... H01L 27/10897; H01L 27/1116; G11C 7/1048; G11C 7/12; G11C 11/4091; G11C 2207/12
See application file for complete search history.

(56) References Cited

U.S. PATENT DOCUMENTS

| 5,825,696 A * | 10/1998 | Hidaka ................. G11C 11/404 257/E27.097 |
| 7,474,549 B2 * | 1/2009 | Chang ..................... G11C 7/12 257/E27.097 |
| 7,541,655 B2 * | 6/2009 | Iwata ...................... G11C 7/12 257/393 |
| 2008/0062790 A1 | 3/2008 | Chang et al. |
| 2015/0041922 A1 | 2/2015 | Takahashi et al. |

FOREIGN PATENT DOCUMENTS

| KR | 100761854 B1 | 9/2007 |
| KR | 20090011560 A * | 2/2009 |

* cited by examiner

*Primary Examiner* — Harry W Byrne
*Assistant Examiner* — R Lance Reidlinger
(74) *Attorney, Agent, or Firm* — William Park & Associates Ltd.

(57) ABSTRACT

A bit line equalizer includes a first line-shaped gate extended in a first direction, a second line-shaped gate spaced apart from the first line-shaped gate by a predetermined distance and extending parallel to the first gate, a third gate configured to interconnect the first gate and the second gate, a first contact node located at one side of the first gate, a second contact node located at one side of the second gate, a third contact node located between the first gate and the second gate and located at one side of the third gate, and a fourth contact node located between the first gate and the second gate and located at the other side of the third gate.

16 Claims, 10 Drawing Sheets

BIT LINE EQUALIZER

CROSS-REFERENCE TO RELATED APPLICATION

The present application claims priority to Korean patent application No. 10-2015-0133963 filed on 22 Sep. 2015, the entire disclosure of which is hereby incorporated in its entirety by reference.

BACKGROUND OF THE INVENTION

Field of the Invention

Embodiments of the present disclosure relate to a bit line equalizer for precharging and/or equalizing pairs of bit lines, and more particularly to a layout structure of a bit line equalizer configured to minimize the height of the bit line equalizer.

Description of Related Art

Generally, semiconductor memory devices such as Dynamic Random Access Memories (DRAMs) may include a plurality of memory cell arrays composed of a plurality of memory cells configured to store data therein. They may also include a plurality of sense-amplifiers disposed between the plurality of memory cell arrays to sense and amplify data stored in the memory cells. Respective sense-amplifiers may be coupled to bit lines and inverted bit lines (also called bit line bars), and may sense and amplify data signals of the bit lines and the inverted bit lines. The above-mentioned operation for sensing and amplifying the data signals using sense-amplifiers will be described in detail hereinafter.

Each bit line and each inverted bit line may be precharged with a predetermined bit line voltage before each word line is enabled. If the word line is enabled, each cell transistor of each memory cell may be turned on, and a data signal corresponding to data stored in the cell may be applied to the bit line by sharing charges between the cell capacitor of the memory cell and the bit line.

The sense-amplifier may detect a difference between a bit-line voltage of the precharged inverted bit line and a data signal of the bit line, amplify the detected difference, and then read data stored in the memory cell.

Since the difference between the bit line voltage and the data signal is very small, it is necessary for the bit line and the inverted bit line to be precharged with the same bit line voltage before the word line is enabled, such that the precharged bit line voltages need to be maintained. For this purpose, the sense-amplifier may include a bit line equalizer configured to maintain the bit line and the inverted bit line at the same bit line voltage.

Figure 1:
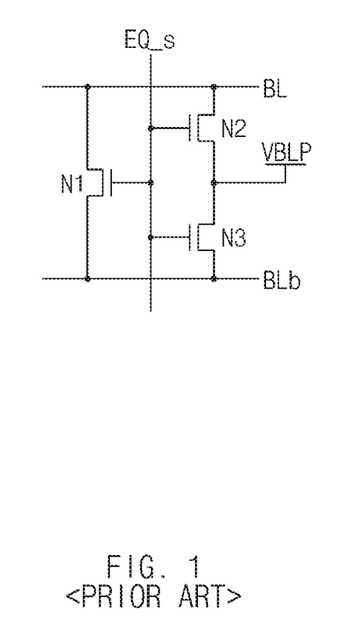
FIG. 1 is a circuit diagram illustrating a conventional bit line equalizer.
Figure 2:
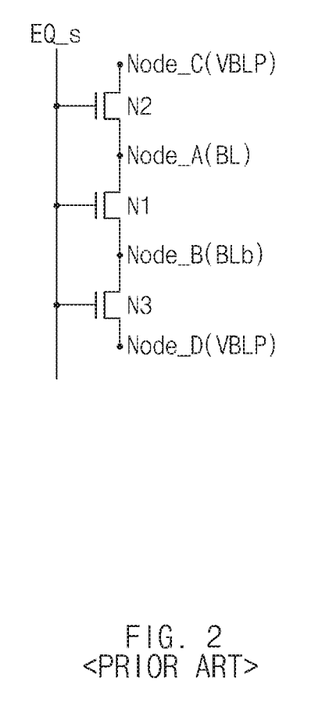
FIG. 2 is a circuit diagram illustrating a conventional bit line equalizer.
Figure 3:
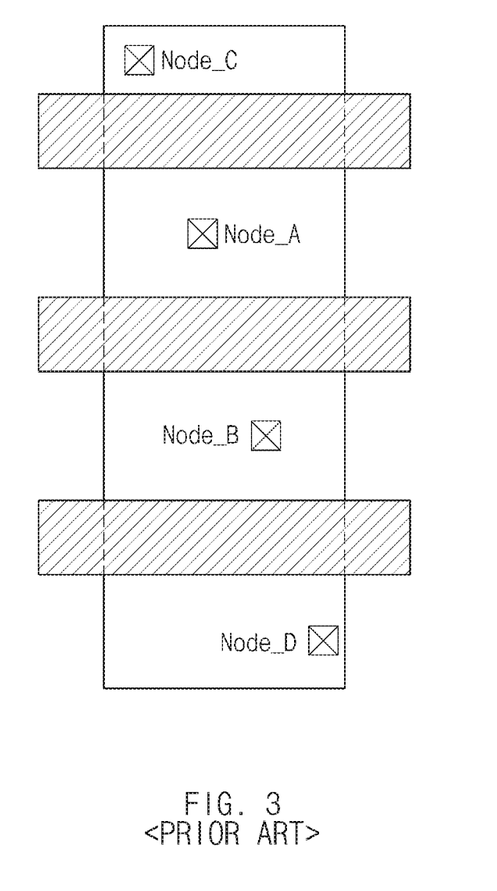
FIG. 3 is a layout structure illustrating the bit line equalizers shown in FIG. 2.

FIGS. 1 and 2 are circuit diagrams illustrating conventional bit line equalizers, and FIG. 3 is a layout structure illustrating the bit line equalizers shown in FIG. 2.

Referring to FIG. 1, the bit line equalizer (EQ) may include an equalize transistor N1 and precharge transistors (N2, N3) coupled between the bit line (BL) and the inverted bit line (BLb).

The precharge transistors (N2, N3) may precharge the bit line (BL) and the inverted bit line (BLb) with a bit line precharge voltage (VBLP).

The equalize transistor N1 may equalize the bit line (BL) and the inverted bit line (BLb) in response to an equalize signal (EQ_s), so that the bit line (BL) and the inverted bit line (BLb) can be maintained at the same bit line precharge voltage (VBLP).

With the increasing integration degree of the semiconductor device, a "⊥"-shaped equalizer shown in FIG. 1 has been gradually modified to a "___"shaped equalizer shown in FIG. 2. The equalizer shown in FIG. 2 includes the equalize transistor N1 and the precharge transistors (N2, N3) coupled in series to the equalize transistor N1, and has a layout structure shown in FIG. 3.

However, if transistors are formed as shown in FIG. 2, the height of each transistor is unavoidably increased.

BRIEF DESCRIPTION OF THE DRAWINGS

In the drawing figures, dimensions may be exaggerated for clarity of illustration. It will be understood that when an element is referred to as being "between" two elements, the element may be the only element between the two elements, or one or more intervening elements may also be present. Like reference numerals refer to like elements throughout.

DESCRIPTION OF EMBODIMENTS

Various embodiments of the present disclosure are directed to providing a bit line equalizer that substantially obviates one or more problems due to limitations and disadvantages of the related art.

An embodiment of the present disclosure relates to a bit line equalizer having a layout structure which is appropriate for a highly-integrated structure without increasing the height of each transistor.

In accordance with an aspect of the present disclosure, a bit line equalizer includes: a first line-shaped gate extended in a first direction; a second line-shaped gate spaced apart from the first line-shaped gate by a predetermined distance, and extended parallel to the first gate; a third gate configured to interconnect the first gate and the second gate; a first contact node located at one side of the first gate; a second contact node located at one side of the second gate; a third contact node located between the first gate and the second gate, and located at one side of the third gate; and a fourth contact node located between the first gate and the second gate, and located at an other side of the third gate.

In accordance with another aspect of the present disclosure, a bit line equalizer includes: a first line-shaped gate extended in a first direction; a second line-shaped gate spaced apart from the first line-shaped gate by a predetermined distance, and extended parallel to the first gate; a third gate configured to interconnect the first gate and the second gate; at least one first contact node located at one side of the first gate; at least one second contact node located at one side of the second gate; and a third contact node located between the first gate and the second gate, and located at one side of the third gate.

In accordance with another aspect of the present disclosure, a bit line equalizer includes: a first active region; a second active region; a first line-shaped gate extended in a first direction such that the first line-shaped gate is formed across the first active region and the second active region; a second line-shaped gate spaced apart from the first gate by a predetermined distance, and extended parallel to the first gate such that the second line-shaped gate is formed across the first active region and the second active region; a third gate located in the first active region, and configured to interconnect the first gate and the second gate; a fourth gate located in the second active region, and configured to interconnect the first gate and the second gate; first contact nodes located in the first active region, and located at both sides so that the first and second gates are interposed therebetween; second contact nodes located in the second active region, and located at both sides so that the first and second gates are interposed therebetween; third contact nodes located in the first active region, and located at both sides of the third gate; and fourth contact nodes located in the second active region, and located at both sides of the fourth gate.

It is to be understood that both the foregoing general description and the following detailed description of embodiments are exemplary and explanatory.

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 4:
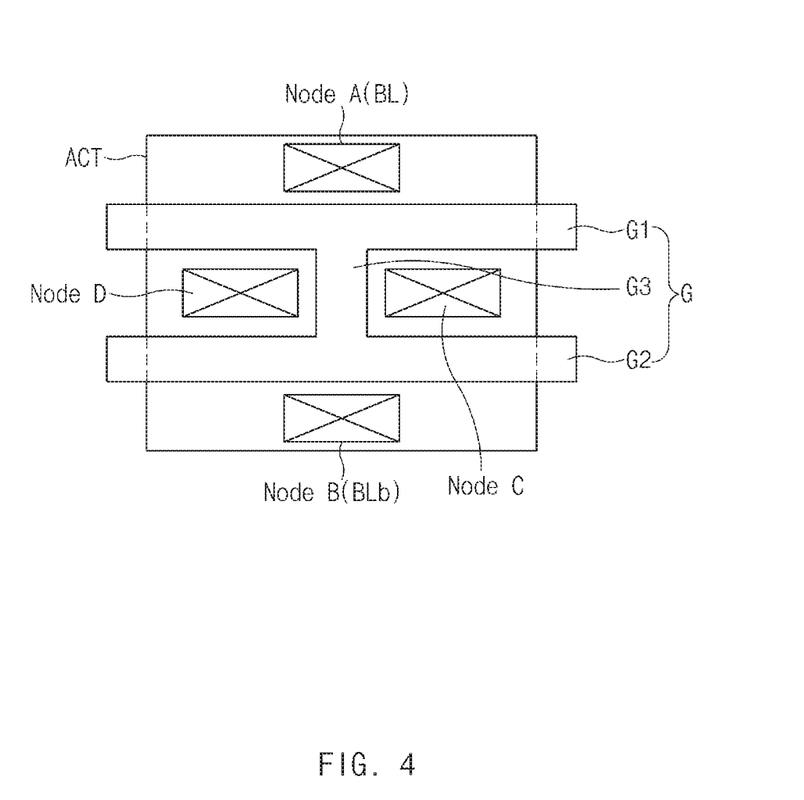
FIG. 4 is a layout structure illustrating a unit bit line equalizer according to an embodiment of the present disclosure.

FIG. 4 is a layout structure illustrating a unit bit line equalizer according to an embodiment of the present disclosure.

The bit line equalizer of FIG. 4 may indicate one unit bit line equalizer, and may be contained in a bit line sense-amplifier (i.e., sense-amp) (not shown). The bit line equalizer may precharge and/or equalize the pair of corresponding bit lines (BL, BLB) in a semiconductor memory device (not shown).

The bit line equalizer may include a gate (G) formed in an active region (ACT); contact nodes (Node A, Node B) respectively coupled to a bit line (BL) and an inverted bit line (i.e., bit line bar) (BLb); and contact nodes (Node C, Node D) coupled to a precharge voltage (VBLP) terminal.

In this case, the gate G may include 2 gate electrodes (G1, G2) spaced apart from each other by a predetermined distance and linearly extended in a first direction; and a gate electrode G3 disposed between the gate electrodes (G1, G2) such that the center parts of the gate electrodes (G1, G2) are coupled to each other by extending in a second direction perpendicular to the first direction. That is, the gate G may be formed in an "H" shape such that the gate electrodes (G1, G2, G3) of the gate G are interconnected.

A contact node (Node A) may be coupled to the bit line BL, and may be arranged at one side of the gate electrode G1. The contact node (Node A) may be located at an opposite side of the gate electrode G1 compared to the location of the gate electrode G3. The contact node (Node A) may be located adjacent to the center part of the gate electrode G1 in the active region (ACT).

The contact node (Node B) may be coupled to the inverted bit line (BLb), and may be formed at one side of the gate electrode G2. The contact node (Node B) may also be located at an opposite side of the gate electrode G2 compared to the location of the gate electrode G3. The contact node (Node B) may also be located adjacent to the center part of the gate electrode G2 in the active region (ACT). That is, the contact nodes (Node A, Node B) may be symmetrical to each other wherein the line of symmetry is a line cutting through the middle of the gate electrode (G3) in the second direction. The contact nodes (Node A, Node B) and the gate electrode G3 may be arranged in a line.

The contact node (Node C) may be coupled to an electrode (not shown) for providing a precharge voltage (VBLP). The contact node (Node C) may be located between the gate electrodes (G1, G2) in the active region (ACT) and may be adjacent to the gate electrode G3.

The contact node (Node D) may be coupled to an electrode (not shown) for providing a precharge voltage (VBLP). The contact node (Node D) may be located between the gate electrodes (G1, G2) in the active region (ACT), and may also be located at an opposite side of the gate electrode G3 compared to the location of the contact node (Node C). In other words, the contact nodes (Node C, Node D) may be located between the gate electrodes (G1, G2) in the active region (ACT), and may be respectively located at both sides of the gate electrode G3.

In the above-mentioned structure, if the equalize signal (EQ_s) is enabled, the gate electrodes (G1, G2, G3) are turned on and at the same time the precharge voltage (VBLP) applied to the contact nodes (Node C, Node D) may be simultaneously supplied to both bit lines (BL, BLb) through the contact nodes (Node A, Node B). That is, the precharge voltage (VBLP) supplied to the contact node (Node C) is simultaneously applied to the pair of bit lines (BL, BLb) through the contact nodes (Node A, Node B) located at both sides. The precharge voltage (VBLP) supplied to the contact node (Node D) is also simultaneously applied to the pair of bit lines (BL, BLb) through the contact nodes (Node A, Node B) located at both sides.

Accordingly, although the size (height) of each gate shown in FIG. 4 is smaller (lower) than those of transistors applied to the conventional bit line equalizer, the same amount of electric charges may be applied to the pair of bit lines (BL, BLb).

Figure 5:
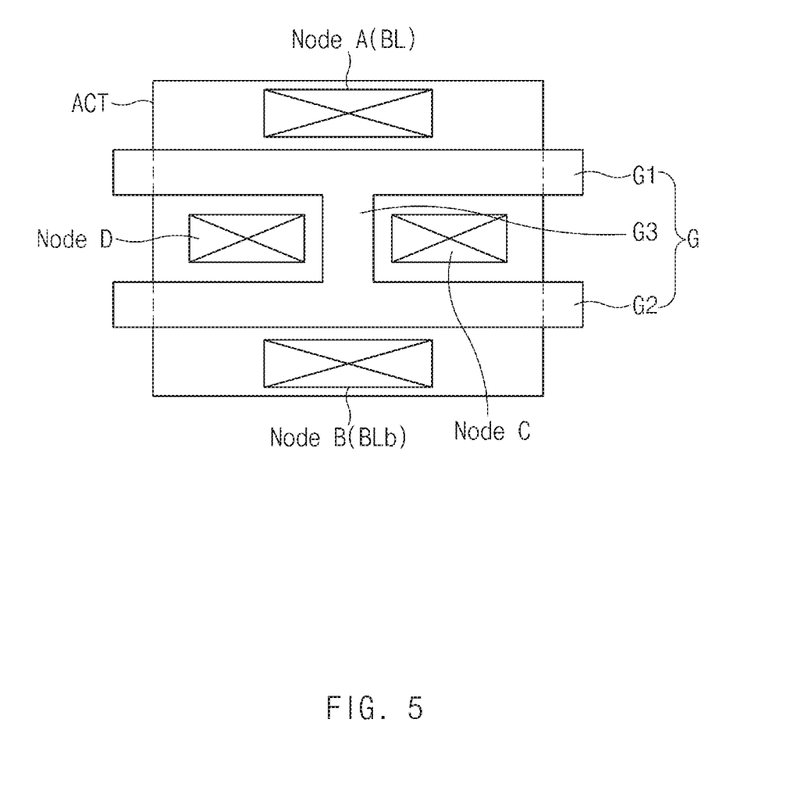
FIG. 5 is a layout structure illustrating a unit bit line equalizer according to another embodiment of the present disclosure.

Although the contact nodes (Node A, Node B) are located one by one in the unit bit line equalizer in FIG. 4, the embodiment is merely an example for convenience of description and better understanding of the present disclosure. A plurality of contact nodes may also be formed in the unit bit line equalizer as necessary in other embodiments. Likewise, the contact nodes (Node A, Node B, Node C, Node D) of FIG. 4 are identical in size for convenience of description and better understanding of the present disclosure as well. As shown in FIG. 5, the contact nodes (Node A, Node B) may also be larger in size than the contact nodes (Node C, Node D).

Figure 6:
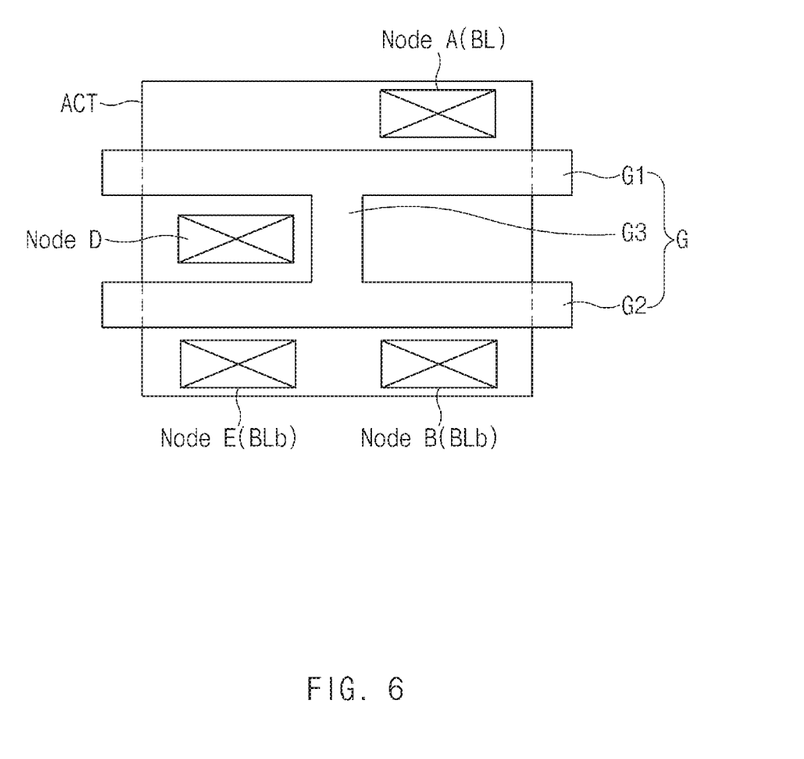
FIG. 6 is a layout structure illustrating a unit bit line equalizer according to another embodiment of the present disclosure.

FIG. 6 is a layout structure illustrating a unit bit line equalizer according to another embodiment of the present disclosure.

When compared to the layout structure of FIG. 4, FIG. 6 maintains the same gate structure (G). However, the positions of contact nodes are partially modified in FIG. 6.

In the gate (G) shown in FIG. 6, gate electrodes (G1, G2) located parallel to each other and a gate electrode G3 for interconnecting the gate electrodes (G1, G2) may be formed, resulting in the "H" shape disclosed in FIG. 4.

Contact nodes (Node A, Node B, Node E) coupled to the pair of bit lines (BL, BLb) may be arranged at both sides of the external part of the gate (G), and the contact node (Node D) coupled to the precharge voltage (VBLP) terminal may be arranged only at one side of the gate electrode G3. In other words, contact nodes (Node A, Node B, Node E) may be arranged at both sides outside the parallel gate electrodes (G1, G2) and not inside said parallel gates. Furthermore, contact node (Node D) may be arranged in one of the two interior openings created by the "H" shape gates. In this case, a plurality of contact nodes (Node B, Node E) may be arranged to at least one of both sides of the external part of the gate (G), while contact node (Node A) may be arranged in the opposite side of the parallel gate electrodes (G1, G2) compared to the location of the plurality of contact nodes (Node B, Node E).

That is, instead of forming only one contact node coupled to a bit line (BL) and one contact node coupled to an inverted bit line (BLb), a plurality of contact nodes coupled to the pair of bit lines (BL, BLb) may be formed. In this case, a plurality of contact nodes (Node B, Node E) are coupled to the inverted bit line (Bib). The contact node (Node E) from among the plurality of contact nodes (Node B, Node E) may be located adjacent to the contact node (Node D) at the opposite side of the gate electrode (G2), and the other contact node (Node B) may be spaced apart from the contact node (Node E) by a predetermined distance in the first direction.

Although several contact nodes coupled to the inverted bit line (BLb) are shown in FIG. 6, the embodiment is merely an example for convenience of description. Several contact nodes coupled to the bit line (BL) may be formed or several contact nodes coupled to the bit line (BL) and the inverted bit line (BLb) may also be formed when necessary.

Figure 7A:
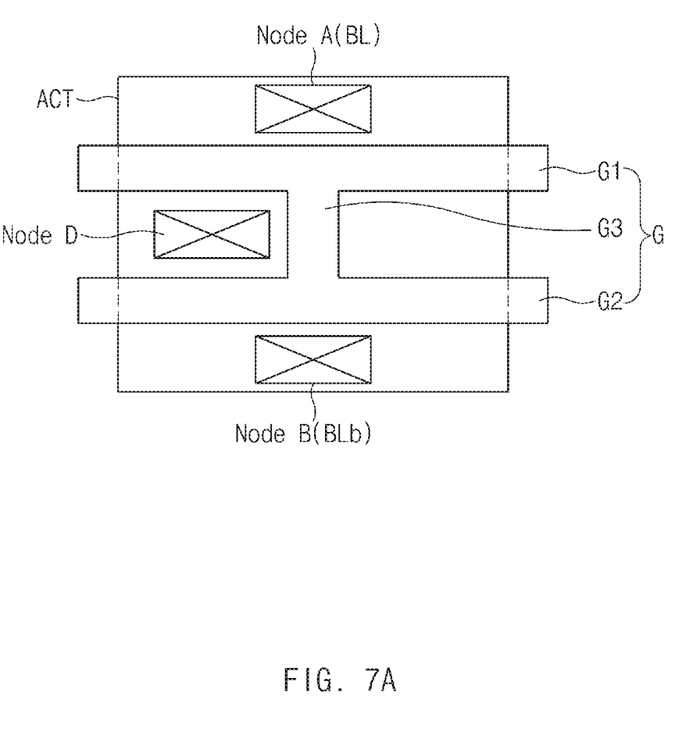
FIGS. 7A and 7B illustrate layout structures of the unit bit line equalizer according to another embodiment of the present disclosure.

In addition, another embodiment discloses one contact node being formed at both sides of the external part of the gate (G) as shown in FIG. 7A. This aspect of the embodiment is the same as the embodiment disclosed in FIG. 1. In this case, the contact nodes (Node A, Node B) formed at both sides of the external part of the gate (G) may be symmetrical to each other wherein the line of symmetry is a line cutting through the middle of the gate electrode (G3) in the second direction, and the contact nodes (Node A, Node B) and the gate electrode G3 may be arranged in a line.

Furthermore, contact node (Node D) may be arranged in one of the two interior openings created by the "H" shape gate. This aspect of the embodiment is the same as the embodiment disclosed in FIG. 6.

Figure 7B:
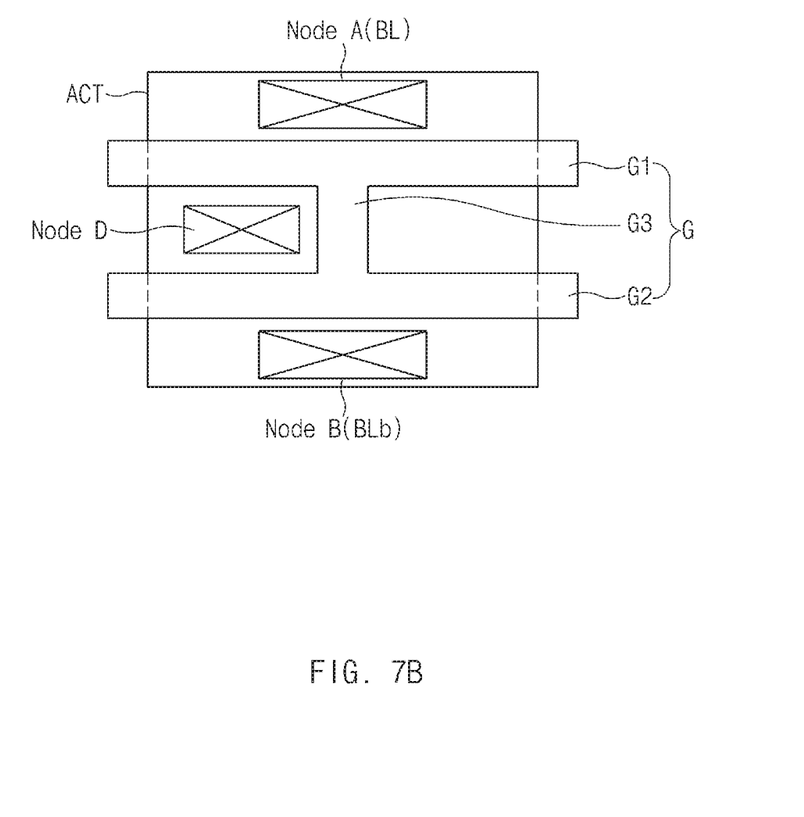

In addition, the arrangement of the contact nodes may be the same as FIG. 7A, but the contact nodes (Node A, Node B) may also be larger in size than the contact nodes (Node C, Node D) as shown in FIG. 7B.

Figure 8:
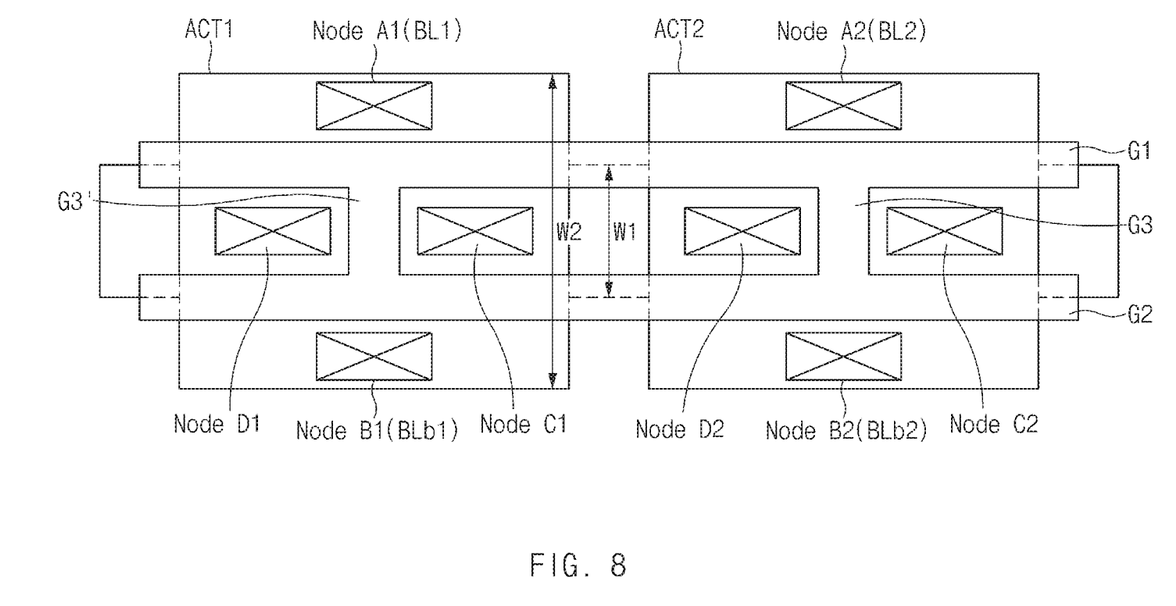
FIG. 8 illustrates that unit bit line equalizers of FIG. 4 are arranged in the form of an array.

FIG. 8 illustrates unit bit line equalizers of FIG. 4 arranged in the form of an array.

As can be seen from FIG. 8, two unit bit line equalizers may be successively coupled to each other. Since several bit line pairs are successively formed in the cell region of the semiconductor device, unit bit line equalizers formed in respective active regions (ACT1, ACT2) corresponding to the several bit-line pairs may be successively connected in the form of an array as shown in FIG. 8. In this case, the contact nodes (Node A1, Node B1) and the contact nodes (Node A2, Node B2) may be coupled to different bit-line pairs, respectively. For example, the contact nodes (Node A1, Node B1) may be respectively coupled to the bit line (BL1) and the inverted bit line (BLb1), and the contact nodes (Node A2, Node B2) may be respectively coupled to the bit line (BL2) and the inverted bit line (BLb2).

In the gate (G) shown in FIG. 8, gate electrodes (G1, G2) may be parallel to each other and may be formed across the active regions (ACT1, ACT2). The gate electrodes (G3, G3') for interconnecting the gate electrodes (G1, G2) may be formed in the respective active regions (ACT1, ACT2).

The active regions (ACT1, ACT2) in which unit bit line equalizers are respectively formed may be integrated into one unit. The integration is possible through a coupling unit, coupling the gate electrodes (G1, G2). In order to maintain effectiveness, a width W1 of a coupling unit may be smaller than a width W2 of each active region (ACT1, ACT2). That is, the width W1 of the coupling unit may not deviate from the external region of the gate electrodes (G1, G2).

Through the above-mentioned structure, when the gate electrodes (G1, G2, G3, G3') are turned on due to the equalize signal (EQ_s) being enabled, the contact nodes (Node C1, Node D2) coupled to the precharge voltage (VBLP) terminal are electrically coupled to each other in the active regions (ACT1, ACT2). However, the contact nodes (Node A1, Node A2), which are coupled to different bit lines (BL1, BL2), are not electrically coupled to each other.

Figure 9:
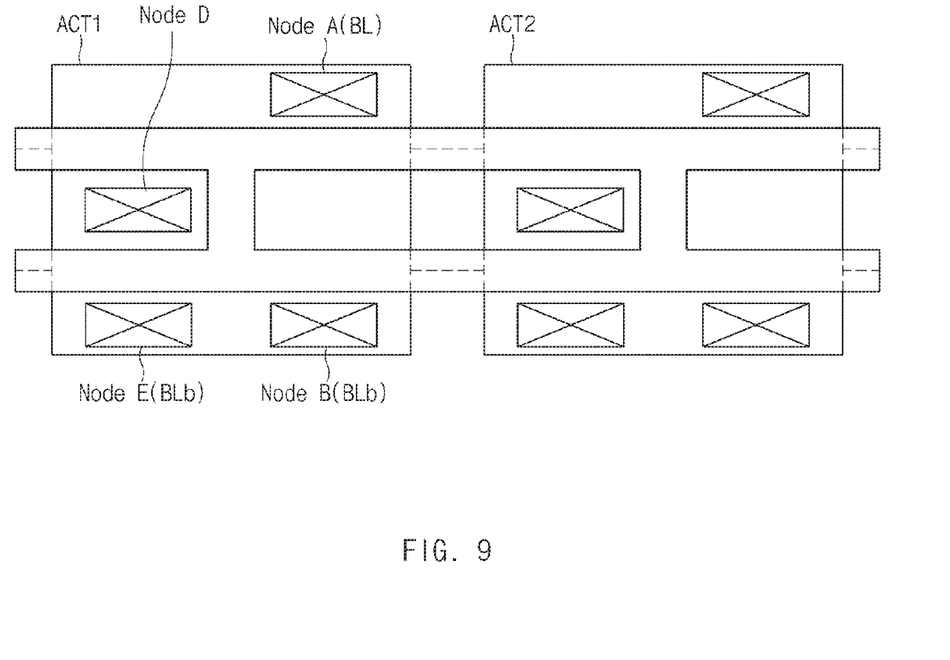
FIG. 9 illustrates that unit bit line equalizers of FIG. 6 are arranged in the form of an array.

Although FIG. 8 shows that the unit bit line equalizers of FIG. 4 are arranged in the form of an array, the embodiment is merely an example for convenience of description and better understanding of the present disclosure. The unit bit line equalizers of FIG. 6 may also be arranged in the form of an array as shown in FIG. 9.

As is apparent from the above description, the embodiments can provide a bit line equalizer having a layout structure which is appropriate for a highly-integrated structure without increasing the height of each transistor.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The invention is not limited by the type of deposition, etching polishing, and patterning steps described herein. Nor is the invention limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:
1. A bit line equalizer comprising:
a first gate extended in a first direction;
a second gate spaced apart from the first gate by a predetermined distance, and extended parallel to the first gate;
a third gate configured to interconnect the first gate and the second gate;
a first contact node located at one side of the first gate;
a second contact node located at one side of the second gate;
a third contact node located between the first gate and the second gate, and located at one side of the third gate; and a fourth contact node located between the first gate and the second gate, and located at an other side of the third gate, wherein the first and second gates are line shaped, and wherein the first, second and third gates are disposed in a single active region.

2. The bit line equalizer according to claim 1, wherein the third gate is located between the first gate and the second gate, and interconnects a center part of the first gate and a center part of the second gate, extending in a second direction perpendicular to the first direction.

3. The bit line equalizer according to claim 1, wherein the first contact node is coupled to a bit line.

4. The bit line equalizer according to claim 1, wherein the second contact node is coupled to an inverted bit line of the bit line.

5. The bit line equalizer according to claim 1, wherein the first gate and the second gate are disposed between the first contact node and the second contact node.

6. The bit line equalizer according to claim 5, wherein the first contact node and the second contact node are symmetrical to each other wherein the line of symmetry is a line cutting through the middle of the third gate in the first direction.

7. A bit line equalizer comprising:

a first gate extended in a first direction;

a second gate spaced apart from the first gate by a predetermined distance, and extended parallel to the first gate;

a third gate configured to interconnect the first gate and the second gate;

at least one first contact node located at one side of the first gate;

at least one second contact node located at one side of the second gate; and a third contact node located between the first gate and the second gate, and located at one side of the third gate, wherein the first and second gates are line shaped, and wherein the first, second and third gates are disposed in a single active region.

8. The bit line equalizer according to claim 7, wherein the third gate is located between the first gate and the second gate, and interconnects a center part of the first gate and a center part of the second gate, extending in a second direction perpendicular to the first direction.

9. The bit line equalizer according to claim 7, wherein the first contact node is coupled to a bit line.

10. The bit line equalizer according to claim 7, wherein the second contact node is coupled to an inverted bit line of the bit line.

11. The bit line equalizer according to claim 7, wherein the first gate and the second gate are disposed between the first contact node and the second contact node.

12. The bit line equalizer according to claim 11, wherein the first contact node and the second contact node are symmetrical to each other wherein the line of symmetry is a line cutting through the middle of the third gate in the first direction.

13. A bit line equalizer comprising:

a first active region;

a second active region;

a first gate extended in a first direction such that the first gate is formed across the first active region and the second active region;

a second gate spaced apart from the first gate by a predetermined distance, and extended parallel to the first gate such that the second gate is formed across the first active region and the second active region;

a third gate located in the first active region, and configured to interconnect the first gate and the second gate;

a fourth gate located in the second active region, and configured to interconnect the first gate and the second gate;

first contact nodes located in the first active region, and located at both sides so that the first and second gates are interposed therebetween;

second contact nodes located in the second active region, and located at both sides so that the first and second gates are interposed therebetween;

third contact nodes located in the first active region, and located at both sides of the third gate; and fourth contact nodes located in the second active region, and located at both sides of the fourth gate, wherein the first and second gates are line shaped.

14. The bit line equalizer according to claim 13, wherein:

the first contact nodes are coupled to a first pair of bit lines; and the second contact nodes are coupled to a second pair of bit lines.

15. The bit line equalizer according to claim 13, further comprising:

a coupling unit configured to interconnect the first active region and the second active region.

16. The bit line equalizer according to claim 15, wherein the coupling unit is disposed between the third contact nodes and the fourth contact nodes.

* * * * *